United States Patent
Berthold et al.

[11] Patent Number: 5,828,172
[45] Date of Patent: Oct. 27, 1998

[54] DIODE MOUNT FOR AN LED WITH A PLUG CONNECTOR AND COMPENSATING RESISTOR, AND A METHOD OF ITS MANUFACTURE

[75] Inventors: Gottfried Berthold, Reutlington; Hans-Michael Schmitt, Muennerstadt; Anton Ruettiger, Wildflecken, all of Germany

[73] Assignee: Preh-Werke GmbH & Co. KG, Bad Neustadt, Germany

[21] Appl. No.: 677,942

[22] Filed: Jul. 10, 1996

[30] Foreign Application Priority Data

Jul. 19, 1995 [DE] Germany ............... 195 26 313.8

[51] Int. Cl.[6] .................................................. H01L 33/00
[52] U.S. Cl. ........................ 313/512; 257/99; 257/100; 257/731; 257/433; 445/1; 445/22; 445/23
[58] Field of Search ............................... 313/512; 257/99, 257/100, 731, 433; 445/1, 22, 23

[56] References Cited

U.S. PATENT DOCUMENTS 4,054,814 10/1977 Fegley et al. .
5,665,983 9/1997 Nagano ................................. 257/100

FOREIGN PATENT DOCUMENTS

PS 209 544 5/1984 Germany .
42 05 789 A 1 9/1993 Germany .

*Primary Examiner*—Nimeshkumar Patel
*Attorney, Agent, or Firm*—Griffin, Butler, Whisenhunt & Szipl, LLP

[57] ABSTRACT

A diode mount for an LED (2) with a plug connector (3) and compensating resistor (4) is manufactured by injection molding a one piece housing and mounting an LED and plug connector therein. An electrical connection between the LED and the plug connector, as well as a mechanical fixing, is accomplished by an electrically-conductive paste (5). At the same time, the electrically-conductive paste forms the compensating resistor.

8 Claims, 1 Drawing Sheet

1

DIODE MOUNT FOR AN LED WITH A PLUG CONNECTOR AND COMPENSATING RESISTOR, AND A METHOD OF ITS MANUFACTURE

BACKGROUND OF THE INVENTION

This invention concerns diode mounts for LEDs having plug connectors and compensating resistors.

Diode mounts constructed of two housing halves are known. An LED with its compensating resistor, as a series resistor of the LED, as well as a plug connector are mechanically mounted on a ceramic plate in a bottom housing half. LED terminals and terminals of the plug connector are electrically coupled to lead strips of the resistor's ceramic plate, for example, by clamps, welds, or solder. A top housing half covers the entire system. Attachment of the built-in parts and the housing halves to one another is accomplished by snapping hooks.

An injection molding process is used to manufacture this prior art diode mount by manufacturing both housing halves, with their snapping hooks and opposite edges, in an injection mold. A further step is involved in manufacturing a resistor plate. This is done by using printed conductive lead strips, or tracks, and terminal contact surfaces, which are thereafter baked, burned or heated; with a resistance layer, for example a Cermet-Paste, being once again printed thereon and again burned. The resistance ceramic plate is separated into individual small plates. Thereafter, all of the individual parts are mounted in the lower housing half, an intercoupling of the LED-resistor-plug connection is made, the resistance is adjusted, and both housing halves are closed.

It is disadvantageous in the above described solution that the structure of the diode mount is complicated as well as time-intensive, and technologically work-intensive, to manufacture.

It is an object of this invention to provide a diode mount of the type described in the opening paragraph above that is structurally less complicated and can be manufactured with fewer work steps.

SUMMARY OF THE INVENTION

According to principles of this invention, a diode mount of the type set forth in the opening paragraph above is constructed of a one piece housing for mounting an LED, a plug connector, and a compensating resistor.

BRIEF DESCRIPTION OF THE DRAWINGS

The invention is described and explained in more detail below using the embodiments shown in the drawings. The described and drawn features, in other embodiments of the invention, can be used individually or in preferred combinations. The foregoing and other objects, features and advantages of the invention will be apparent from the following more particular description of a preferred embodiment of the invention, as illustrated in the accompanying drawings in which reference characters refer to the same parts throughout the different views. The drawings are not necessarily to scale, emphasis instead being placed upon illustrating principles of the invention in a clear manner.

DESCRIPTION OF THE PREFERRED EMBODIMENT

Figure 1:
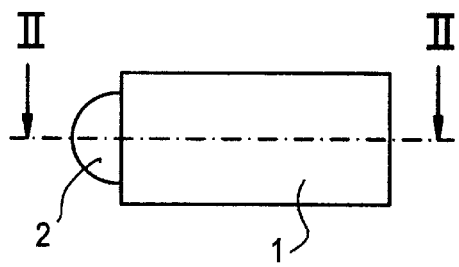
FIG. 1 is a top view of a diode mount of this invention.
Figure 2:
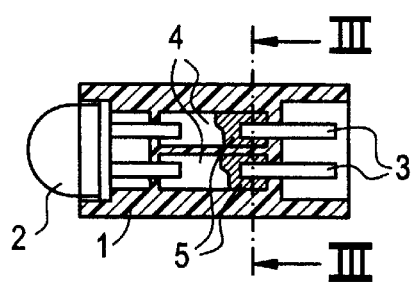
FIG. 2 is a cross sectional view taken on line II—II in FIG. 1.
Figure 3:
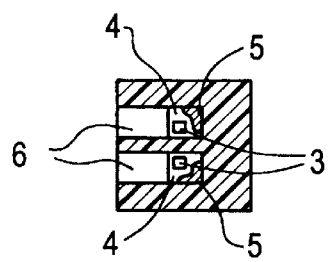
FIG. 3 is a cross sectional view taken on line III—III in FIG. 2, for a first embodiment of this invention.

A diode mount is mainly constructed of a one-piece, injection-molded, housing 1, preferably of a non-conductive polyamide resin or other resinous plastic (FIG. 1). The housing 1 is first injected by means of a generally known injection process and an injection mold, which is not described in detail, to preferably have pockets, or cavities, 6. Contact lugs of a plug connector 3, as well as terminals of an LED 2 are pressed or mounted, in the housing 1 in walls forming the pockets. An electrically conductive paste 5, of a polymer binding material with a conductive material, or pigment, dispersed therein, preferably of carbon, is injected, or sprayed, through openings into the pockets 6 (compare FIGS. 2 and 3) with a dosing device. This paste 5 hardens and forms compensating, resistors 4 as parts of series resistors 4 of the LED 2. The contact lugs of the plug connector 3 are electrically coupled with the compensating resistors 4. At the same time, when the electrically-conductive paste 5 has hardened, a mechanical fixing of the LED 2 and the plug connector 3 is accomplished in the diode mount, that is, they are fixedly integrated into the housing 1, as are the compensating resistors 4 as well. The amount of space in the pockets 6, and the amount of paste 5, provide a coarse determination of a compensating resistance value of the compensating resistor. A fine balancing, or adjustment, of the compensating resistors 4 is accomplished by means of a not-further-explained laser, or mechanical, adjustment carried out through side openings in the pockets 6.

Figure 4:
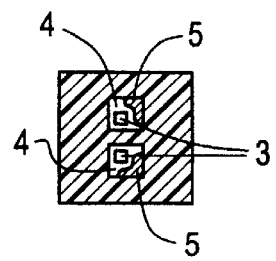
FIG. 4. Is a view similar to FIG. 3, but showing a different embodiment.

Instead of the above-described manufacturing procedure, the diode mount can also be manufactured in a two-step injection process. First the terminals of the LED 2 and contact lugs of the plug connector 3 are placed in a not-described-in-detail two-step injection mold and the electrically-conductive paste 5 is injected in a first injection. This determines the coarse compensating resistance value. The paste 5 hardens and forms the compensating resistors 4 as part of the resistance of a series resistance of the LED. At the same time, an electrical coupling between the terminals of the LED 2 and the contact lugs of the plug connector 3, as well as a mechanical fixing thereof, are accomplished. An insulating outer housing 1 is then molded as a second injection about the LED 2, paste 5 and plug connector 3. Also, in this manufacturing process the housing 1 can have openings in the pockets 6; however, it can also be removed from the injection mold as a closed housing (see FIG. 4). In this regard, by use of a very fine, strong, laser beam (for example) very fine openings, preferably one per compensating resistor, can be burned in the housing so that fine adjustments of these compensating restistors can be made through these openings.

It should be understood that the invention is not limited to the particularly depicted embodiments, rather many modifications are possible within the scope of the invention. For example, the plug connector 3 can be arranged perpendicular to the LED 2. Also, use of an injection molding process allows an oppositely-sequenced process, that is, the described embodiment in which manufacturing is done from the outer housing 1 inwardly can be accomplished working from the inside outwardly; and where the manufacturing is described as being done inside outwardly, it can be reserved. An outer surface of the housing 1 can have a round shape in the cross section III—III, instead of the rectangular shape shown.

By using the injection process, a one piece house is manufactured. An outer shape is determined, for example, by a collar of an LED to be received and a plug connector and, therefore, it need not be described in greater detail, because it is variable according to demands. Preferably, pockets with small openings are in the housing. An electrically conductive paste is injected, or sprayed, into these pockets. The paste hardens and forms compensating resistors for the LED. At the same time that an electrical coupling between the LED and plug connector are made, both are mechanically fixed. The thusly manufactured diode mount with LED, plug connector and integrated compensating resistor is sturdy, quite uncomplicated in structure, easily replaceable and economical. These diode mounts find use in, for example, automobile-dashboard circuits.

While the invention has been particularly shown and described with reference to a preferred embodiment, it will be understood by those of ordinary skill in the art that additional various changes in form and detail may be made therein without departing from the spirit and scope of the invention.

The invention claimed is:

1. Diode mount for an LED with a plug connector and a compensating resistor;

wherein the diode mount is constructed of a one piece housing for mounting the LED, the plug connector, and the compensating resistor;

wherein the compensating resistor is formed of an electrically-conductive paste which has been hardened in the housing;

wherein an electrical connection and a mechanical affixing of the LED and the plug connector is made by the electrically-conductive paste; and wherein the housing has at least one pocket for receiving the electrically-conductive paste.

2. Diode mount as in claim 1 wherein the shape and dimensions of the at least one pocket determines a coarse compensating resistance value.

3. Diode mount as in claim 1 wherein the electrically-conductive paste is formed of a polymer binding material with a conductive material dispersed therein.

4. Diode mount as in claim 1 wherein the housing is of a polyamide resin.

5. A process to manufacture a diode mount for the LED of claim 1 with the plug connector and the compensating resistor comprising the steps of: producing the one piece housing by injection molding to have at least one pocket therein; mounting the LED, the plug connector, and the compensating resistor in the one-piece housing.

6. The process as in claim 5 wherein contact lugs of the plug connector and terminals of the LED are mounted in the housing so that they extend into the at least one pocket.

7. The process as in claim 6 wherein is further included the step of injecting electrically-conductive paste into the at least one pocket by means of a dosing device and thereafter allowing the electrically-conductive paste to harden.

8. The process for manufacturing the diode mount of claim 1 wherein terminals of the LED and contact lugs of the plug connector are first placed in a two-step injection mold, wherein in a first injection an electrically-conductive paste is injected about said terminals and contact lugs to form said compensating resistor, and wherein, in a second injection an outer, non-conductive, housing is molded about the electrically-conductive paste to form said one piece housing.

* * * * *

UNITED STATES PATENT AND TRADEMARK OFFICE
CERTIFICATE OF CORRECTION

PATENT NO.   : 5,828,172
DATED        : Oct. 27, 1998
INVENTOR(S)  : Gottfried Berthold et al.

It is certified that error appears in the above-indentified patent and that said Letters Patent is hereby corrected as shown below:

First page, Inventors Section, beside the name Gottfried Berthold, change the name of the city to be "Reutlingen".

Signed and Sealed this

Twenty-third Day of March, 1999

Attest:

Q. TODD DICKINSON

Attesting Officer

Acting Commissioner of Patents and Trademarks